United States Patent [19]

Miller

[11] Patent Number: 4,965,834
[45] Date of Patent: Oct. 23, 1990

[54] MULTI-STAGE NOISE-REDUCING SYSTEM

[75] Inventor: Harry B. Miller, Niantic, Conn.

[73] Assignee: The United States of America as represented by the Secretary of the Navy, Washington, D.C.

[21] Appl. No.: 328,651

[22] Filed: Mar. 20, 1989

[51] Int. Cl.$^5$ ............................................. H04B 15/00
[52] U.S. Cl. ...................................................... 381/94
[58] Field of Search ...................... 381/94, 71; 367/123

[56] References Cited

U.S. PATENT DOCUMENTS 4,589,137  5/1986  Miller ..................................... 381/94
4,649,505  3/1987  Zinser, Jr. et al. .................... 381/71

OTHER PUBLICATIONS

Heinone, et al., FIR-Median Hybrid Filters, IEEE Transactions on Acoustics, Speech, and Signal Processing, vol. ASSP-35, No. 6, Jun., 1987.

Primary Examiner—Forester W. Isen
Attorney, Agent, or Firm—Michael J. McGowan; Prithvi C. Lall

[57] ABSTRACT

An electronic noise-reducing system which includes a plurality of adaptive filters forming multiple stages of noise reduction and producing greatly increased signal-to-noise ratio. The input for the primary channel of the first adaptive filter, which forms the first noise-reducing stage, is the signal including multitones buried in noise. The reference channel ideally uses signal-free noise as input. The output of the first adaptive filter is used as the input to the primary channel of the second or final adaptive filter, whereas the reference channel thereof is fed with "clean noise". The clean noise can be obtained as the output of the intermediate adaptive filter by feeding simultaneously both the primary and reference channels of the intermediate filter with the noise-reduced waveform present at the output of the first noise-reducing filter.

8 Claims, 8 Drawing Sheets

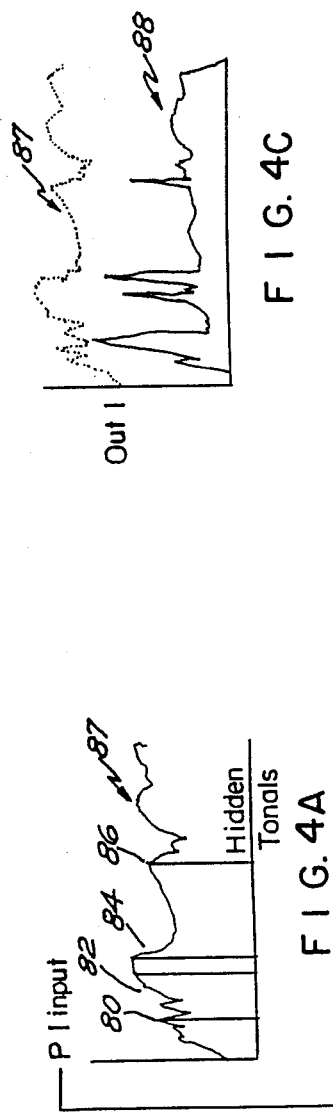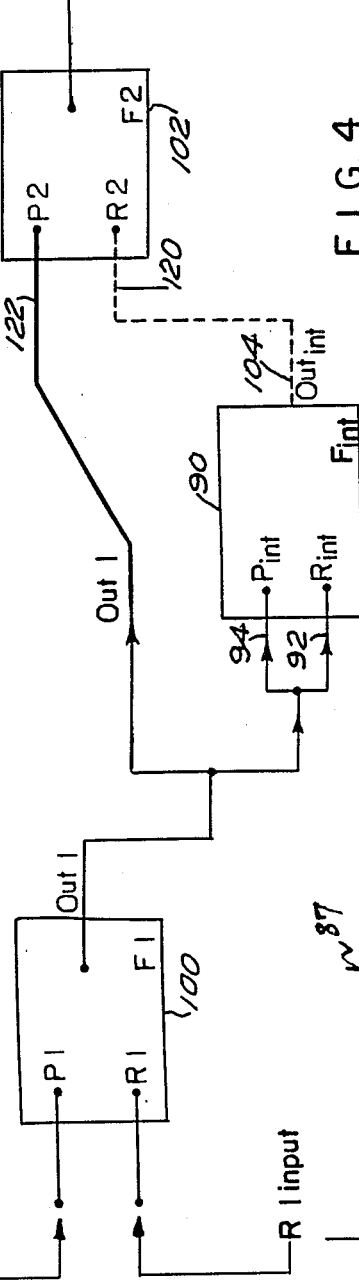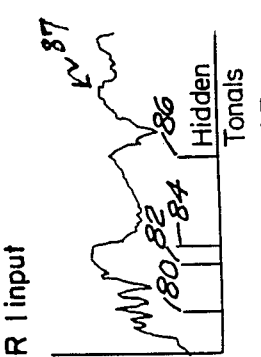

MULTI-STAGE NOISE-REDUCING SYSTEM

STATEMENT OF GOVERNMENT INTEREST

The invention described herein may be manufactured and used by or for the Government of the United States of America for governmental purposes without the payment of any royalties thereon or therefore.

BACKGROUND OF THE INVENTION

(1) Field of the Invention

Subject invention is related to signal processing in general and more particularly to a multi-stage system using adaptive filters for canceling noise without affecting the signal and thereby increasing signal-to-noise ratio, i.e., S/N.

(2) Description of the Prior Art

In my U.S. Pat. No. 4,589,137 and my pending patent application, Ser. No. 220,692, filed July 5, 1988 which are both incorporated here in entirety, one-stage noise-reducing systems were discussed wherein a single tone's S/N ratio was increased 17 dB by causing the noise in nearby frequency bands to attenuated by 17 dB. Extension of this work resulted in the "unmasking" of four tones (masked by broadband noise) at normalized frequencies of, roughly: 1, 2, 3 and 5 spread over a decade. The original masking noise was reduced over more than a decade of frequency by anywhere from 15 dB to 25 dB.

The adaptive filter using the Least Mean Squares (LMS) algorithm favors noise peak region's and tends not to favor noise dip-regions, so that the 15 dB attenuation occurred at dip regions while the 25 dB attenuation occurred at peak regions. A reasonable number would be 20 dB for the average attenuation of noise attained across a broadband. However, 20 dB attenuation is not sufficient for many applications, and so an attempt to cascade two or more stages of adaptive filters seemed worthwhile in order to try to attain 35 dB or 40 dB of attenuation.

SUMMARY OF THE INVENTION

We start with the output of a one-stage noise-canceling system. A reduction of about 20 dB in broadband noise over a band greater than a decade was accomplished routinely, using either a time-domain adaptive filter or a frequency-domain adaptive filter. But this noise floor, which we will arbitrarily call $-20$ dB, would not drop lower. In addition, if the original noise spectrum had a fairly sharp dip somewhere, this was ignored by the adaptive filter so that it became a residual peak, which we named a stalagmite. So the goal of the present invention was to start with the output $O_1$ of a first adaptive filter $F_1$ and to feed it in tandem into a second adaptive filter $F_2$, with the assistance of a third or "intermediate" adaptive filter $F_{int}$, and thereby lower the noise floor by perhaps an additional 13 dB, thus lowering the noise overall to $-33$ dB ($-20$ dB and $-13$ dB), all without greatly attenuating the N tones already unmasked in the output of the first filter.

An object of subject invention is to have a noise-canceling system which does not require a large volume of sound-absorbing material.

Another object of subject invention is to have a noise-canceling system which reduces the noise over a wide frequency bandwidth.

Still another object of subject invention is to have a noise-canceling system which uses multiple adaptive filters in order to obtain larger overall noise reduction.

Other objects, advantages and novel features of the invention may become apparent from the following detailed description of the invention when considered in conjunction with the accompanying drawings wherein:

BRIEF DESCRIPTION OF THE DRAWINGS

FIGS. 4 and 4A–4E show the block diagram and signal profiles for the decorrelation method of noise reduction using subject invention.

DESCRIPTION OF THE PREFERRED EMBODIMENT

Figure 1:
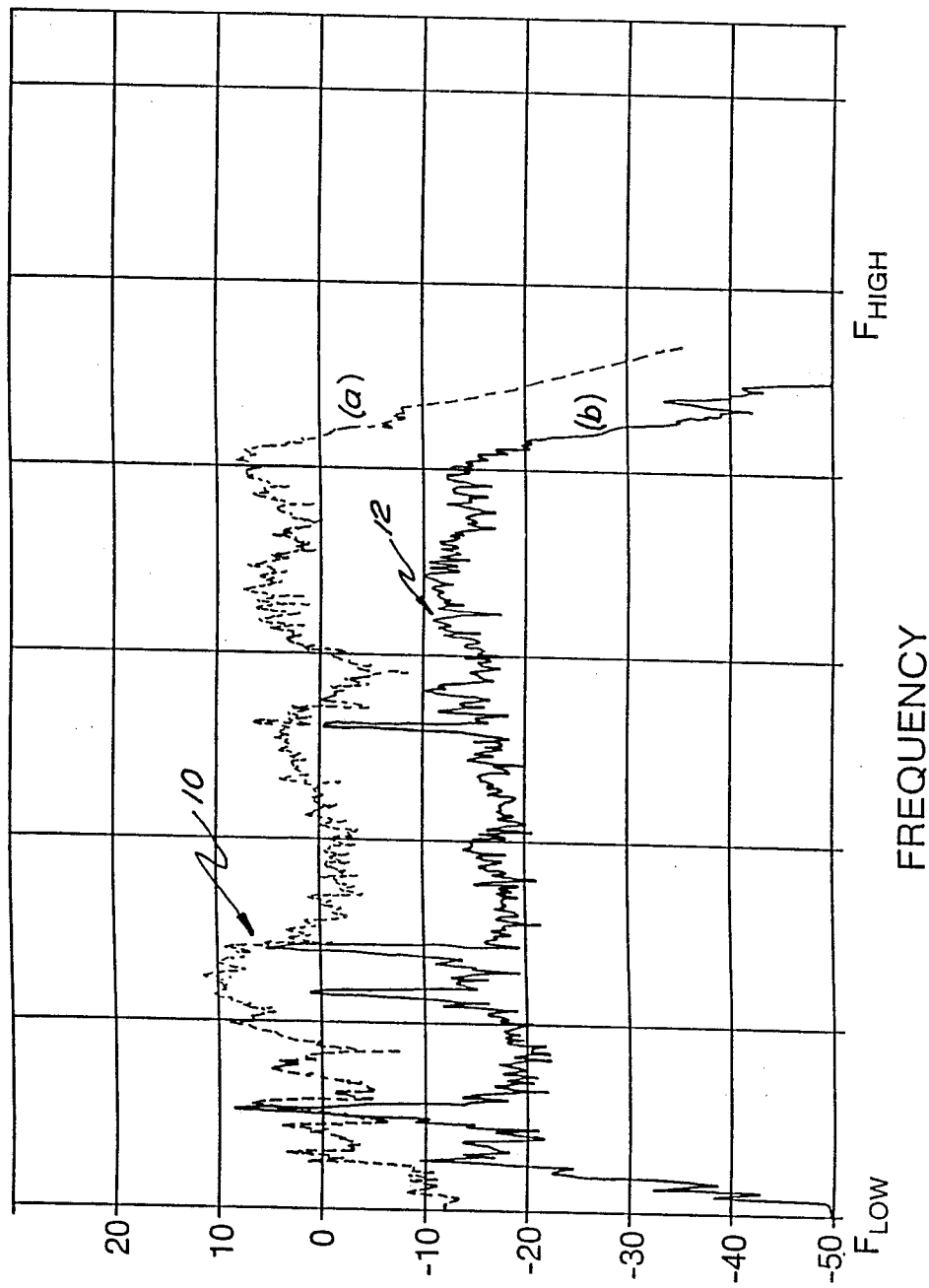
FIG. 1 is a graphical representation of the signal-plus-noise (S+N) input wave and the signal-plus-noise output wave of one adaptive filter, to be used as an input to the next adaptive filter over a given frequency range.

It should be noted that throughout our discussion each of the adaptive filters has a primary (P) channel and a reference (R) channel with subscripts designating the adaptive filter under discussion. The problem in a two-stage noise canceler is: what to feed into the reference channel $R_2$ of adaptive filter $F_2$. The input to the primary channel $P_2$ of adaptive filter $F_2$ should be the output of $F_1$. The desired input to reference channel $R_2$, which is always the output of an adaptive filter called intermediate adaptive filter $F_{int}$, would be a near-duplicate to the output of adaptive filter $F_1$ except with the N tones removed, so that the reference channel could truly be said to contain only signal-free noise. We will refer to this as "clean noise". FIG. 1 shows the amplitude of sound pressure over a frequency range between $f_{low}$ and $f_{high}$ including both signal and wide band noise, the input sound pressure wave (signal+noise) being represented by curve 10 and the output of the first adaptive filter which is also the input to the second filter being represented by curve 12.

Figure 2:
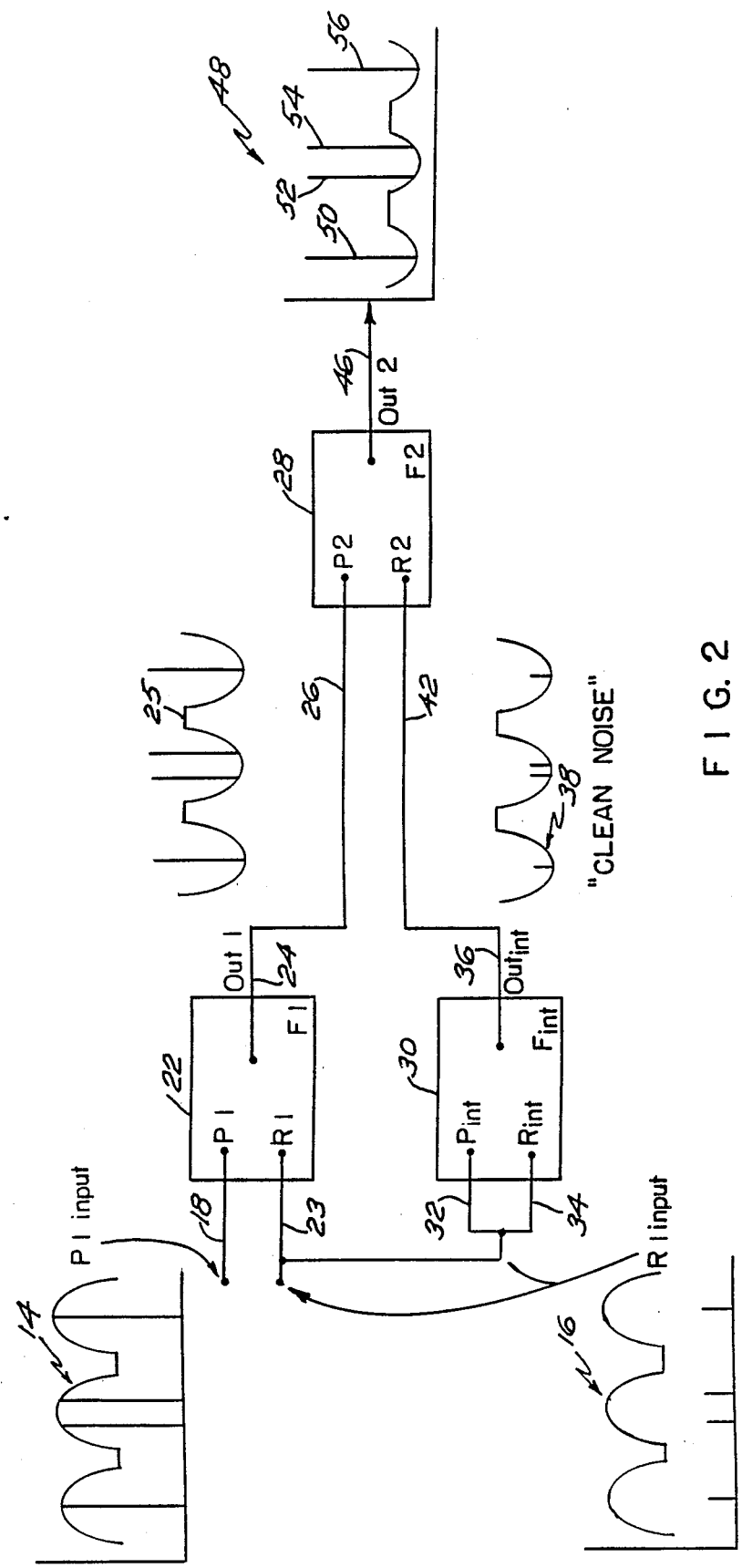
FIG. 2 is a representation of typical inputs to the primary and reference channels of the first adaptive filter and primary and reference channels of an intermediate adaptive filter and a second adaptive filter, together with the improved output from the second filter.

A few methods will be described, which were used to lower the noise floor and/or to remove the stalagmites.

a. Mirror-Image Method: It had been observed that any adaptive filter such as $F_1$ did not "go after" the whole band of noise, designated by 14 in FIG. 2, simultaneously, but rather that it worked on the peak regions first, and the dip regions later. This tends to create a mirror-image of 14, the input 18's ($P_1$) noise, at the output $O_1$ or 24 of $F_1$ (disregarding the signal for the moment), as shown in FIG. 2. Note that the tones survive undiminished. The output at $O_1$, namely sound pressure wave 25, then feeds into the input $P_2$ (26) of a second adaptive filter $F_2$ (28).

Simultaneously the "signal-free noise" or "noise plus residual signal" designated as 16 at reference input 23 ($R_1$) of adaptive filter $F_1$ (22) as shown in FIG. 2, feeds also into an adaptive filter called $F_{intermediate}$ or 30 ($F_{int}$). This noise 16 feeds into both input channels 32 ($P_{int}$) and 34 ($R_{int}$), as shown in FIG. 2, via a tee connection.

To define a term called "partial convergence" which we will use presently, we first define another term, "full convergence", as a term used to describe the action from an adaptive filter when it has canceled noise as much as possible. If full convergence is aborted, we call the process "partial convergence". When partial convergence is used in $F_{int}$, the output at 36 (output$_{int}$), namely 38, tends to be a mirror-image of the input 16 at 34 ($R_{int}$ input) as seen in FIG. 2 and thus is almost identical with sound pressure wave 25 at output 24 ($O_1$) of $F_1$ (except for the virtual absence of signal components). We call the sound pressure wave 38 "clean noise".

Figure 3:
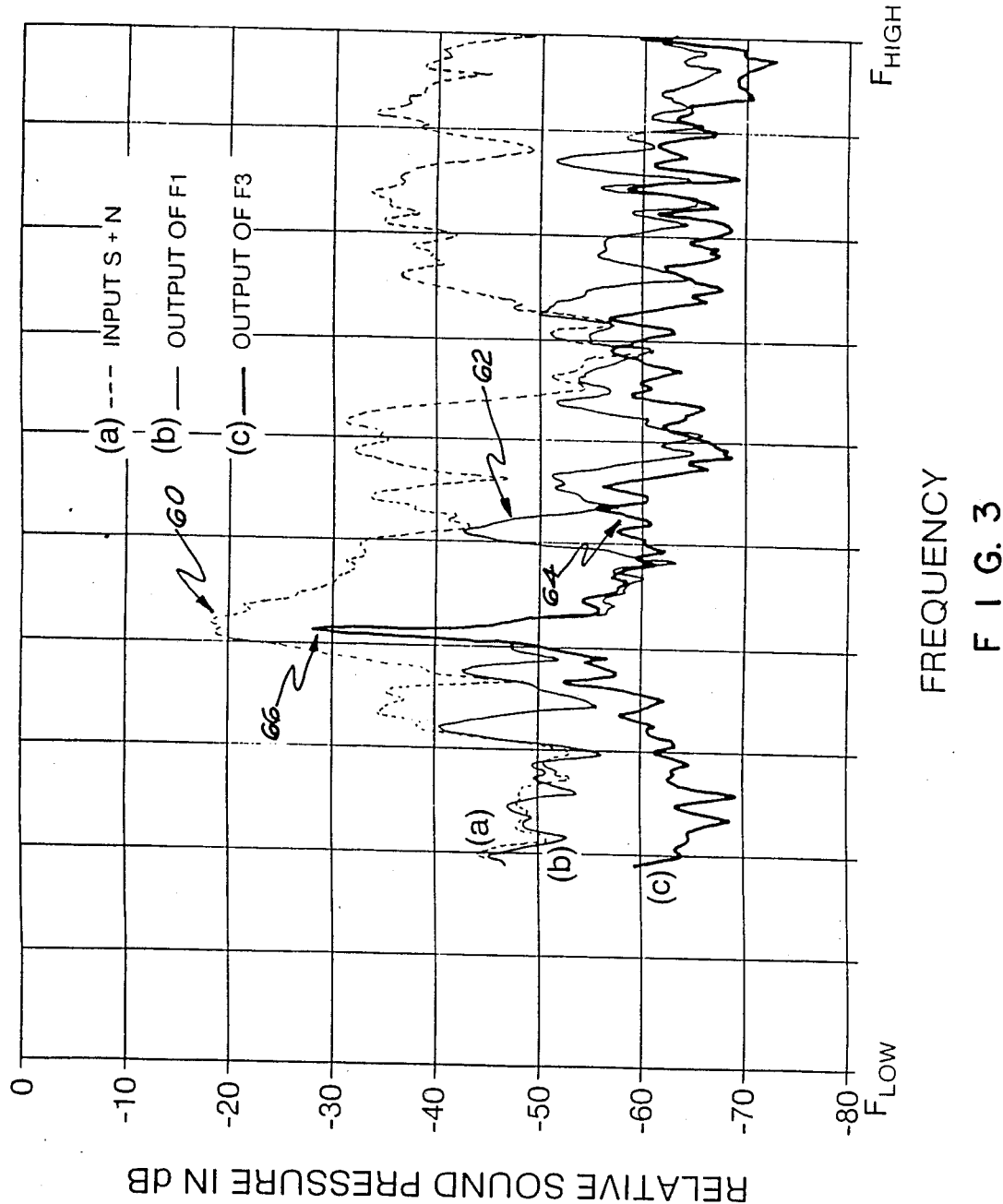
FIG. 3 is a graphical representation, using experimental data, of the input and output of the first adaptive filter as compared with the output of the second or final adaptive filter.

If now the sound pressure wave 38 at output$_{int}$ 36 is fed into reference input or channel 42 ($R_2$) of adaptive filter 28 ($F_2$), any stalagmites existing in sound pressure wave 25 at Output 24 ($O_1$) will cancel at appreciably at Output 46 ($O_2$) of adaptive filter 28 ($F_2$). The output at 46 has a wave form 48 where tones 50, 52, 54 and 56 are unattenuated and the stalagmites 58 are low. Additionally some of the residual noise will cancel further, across the whole band. This is also shown in FIG. 3, using experimental data, wherein curve 60 shows a noise-spectrum plus a hidden tone, i.e., input S+N. Curve 62 shows the results of a first cancellation (observe the stalagmites on either side of the tone 66 of FIG. 3). Curve 64 shows the results of a second cancellation, where the stalagmites are much reduced. Since the mirror-image method works best for an "unwhitened" noise spectrum, it is advisable to "pre-unwhiten" the noise spectrum, via a spectral shaper of both magnitude and phase, into a first set of mountains and valleys feeding into a first noise-reduction system; and simultaneously "pre-unwhiten" the noise spectrum into a second set of mountains and valleys staggered or offset from the first set.

b. The Noise-Decorrelation Method. In the mirror-image method the "clean noise" was generated in the intermediate adaptive filter by supplying its $P_{int}$ and $R_{int}$ inputs (via a tee connection) with the same raw input that was used in filter $F_1$'s $R_1$ channel as shown in FIG. 2. In the noise-decorrelation method, as shown in FIG. 4, the "clean noise" curve 105 of FIG. 4D is generated in the intermediate filter $F_1$ or 90 by supplying its $P_{int}$ and $R_{int}$ inputs (via a tee connection) with the noise-reduced Output$_1$, namely curve 88, of filter $F_1$ (100) as shown in FIG. 4. It should be noted that curve 87 represents the input signal-plus-noise as shown in FIGS. 4A-4E. The signal, e.g., the four tones which exist superposed on the noise, as seen in the solid curve 88 of FIG. 4C, entering 90 ($F_{int}$) must be removed in order to produce "clean noise" at the output of adaptive filter 90 ($F_{int}$). This can be done by one of the following methods.

1. A delay of say 20 msec can be inserted within the reference channel 92 ($R_{int}$). This shifts the signal and the noise (in the reference channel) by 20 msec, in the time domain, enough to decorrelate the noise from its counterpart in $P_{int}$ (94), but with no effect on a repetitive signal, e.g., a tone, which keeps repeating its time-domain signature. Full convergence is allowed to take place in all three adaptive filters 90, 100 and 102. Only the original tone peaks subtract because only they are still correlated. They decrease to small values. The spectrum at Output$_{int}$ (104) is then called "clean noise" and is shown as curve 105 of FIG. 4D and again as curve 110 of FIG. 5. The final adaptive filter 102 ($F_2$) receives the "clean noise" at input $R_2$ and receives the original output ($O_1$) at input $P_2$. A second cancellation then occurs within adaptive filter 102 ($F_2$). The result is curve 114, as shown in FIG. 6.

2. Alternatively, a delay of say 20 msec can be inserted in the primary channel 94 ($P_{int}$) of the intermediate filter 90 ($F_{int}$) as seen in FIG. 4. Full convergence must be aborted, since otherwise the filter 90 ($F_{int}$) will slowly cancel everything that is residing within channel 94 ($P_{int}$). Partial convergence of $F_{int}$ must be used, with a duration time of, for example, only 4 seconds and then the convergence being frozen. Filters 100 ($F_1$) and 102 ($F_2$), however, are meanwhile allowed to fully converge, and then run continuously. The original tone peaks in channel 92 ($R_{int}$) disappear by subtraction because they are still highly correlated with their counterparts in channel 94 ($P_{int}$). The spectrum 105 from output$_{int}$ (104) is again called "clean noise". The final adaptive filter 102 ($F_2$) receives the "clean noise" at input channel 120 ($R_2$), and receives the noise-reduced wave 88 from Output$_1$ at input channel 122 input ($P_2$). A second cancellation then occurs within 102 ($F_2$). The result is the same as shown in FIG. 6, where the noise floor has dropped by almost an additional 20 dB, to a level of −40 dB. Recapitulating the events, a signal-plus-noise input, the output of the first adaptive filter, and the combination of first stage and second stage cancellation are shown in FIG. 7 as curves 130, 132 and 134 respectively.

Figure 5:
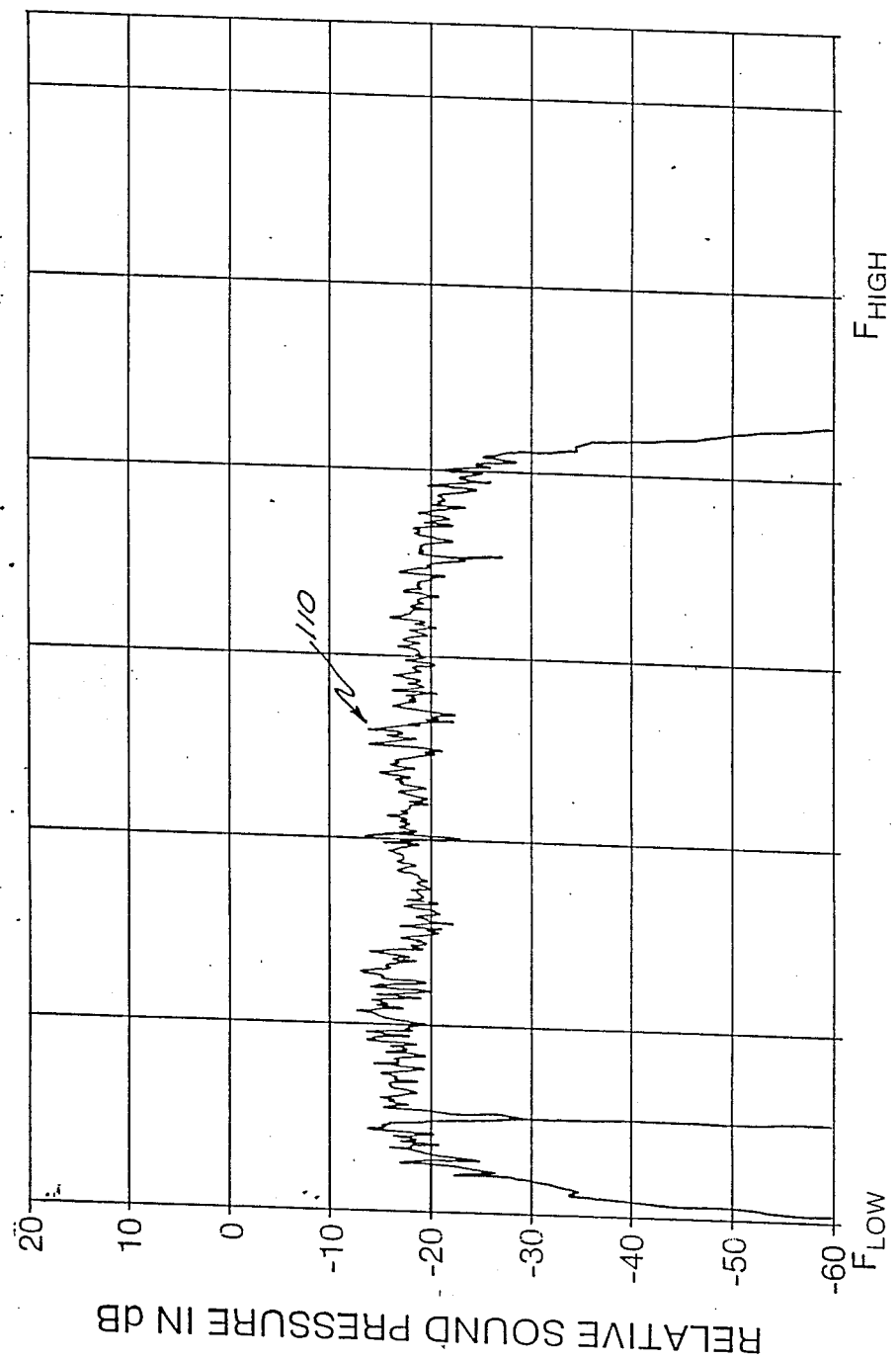
FIG. 5 shows the "clean noise" output of the intermediate adaptive filter $F_{int}$ as a function of frequency.

3. A different method of achieving "clean noise" is to send the noise-reduced spectrum of FIG. 1 through a thresholding device which clips the magnitude of each spectral peak down to that of the neighboring noise level. That portion of the spectrum which fails to be clipped is preserved, and used as the "clean noise" input to $R_2$ of a second adaptive filter 102 ($F_2$). This method is especially useful when the "surviving spectrum" is nearly flat, like white noise, as seen in FIG. 5.

Figure 6:
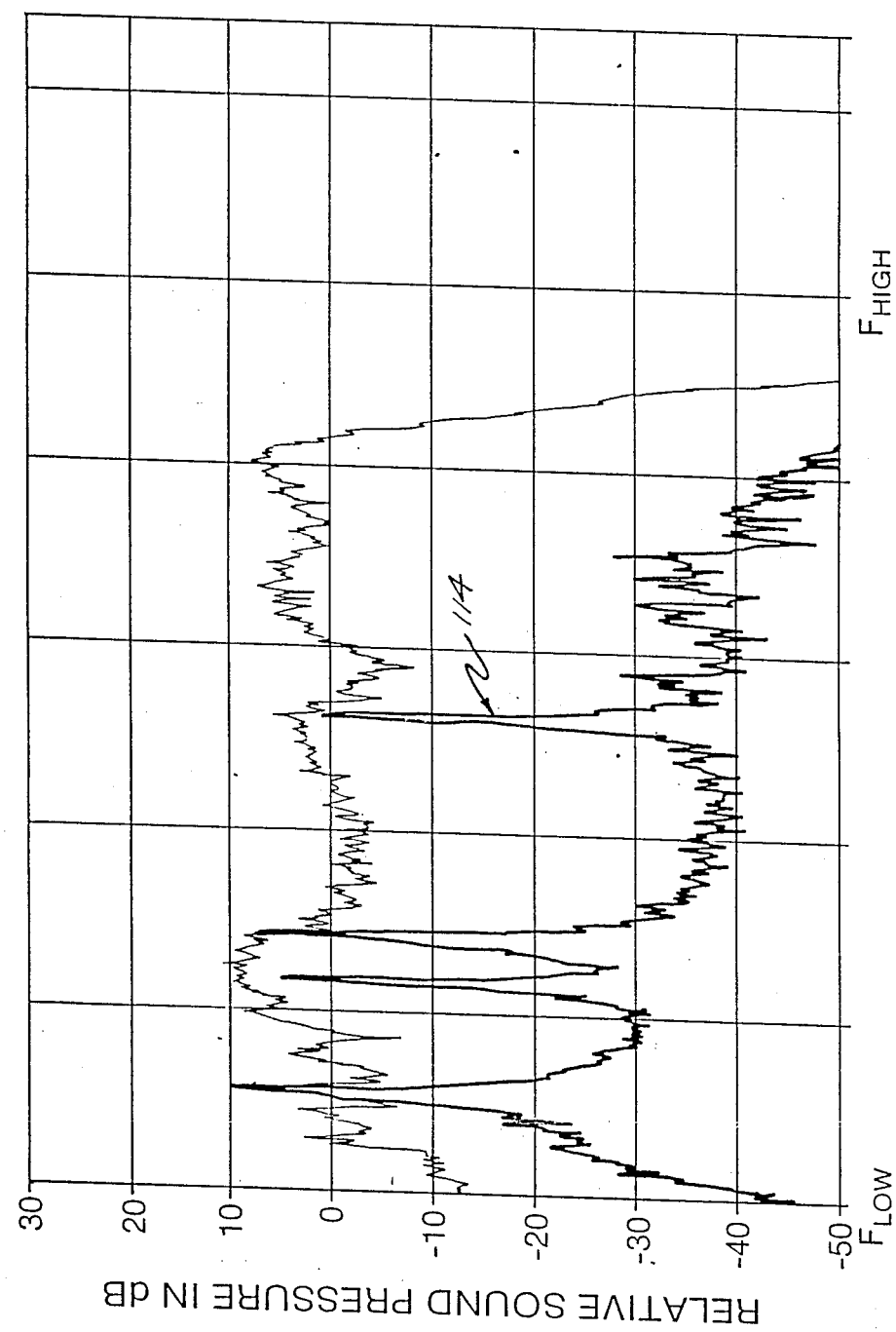
FIG. 6 shows the input sound wave (signal-plus-noise) to the first filter, and the output sound wave from the final or second filter over the given frequency range.
Figure 7:
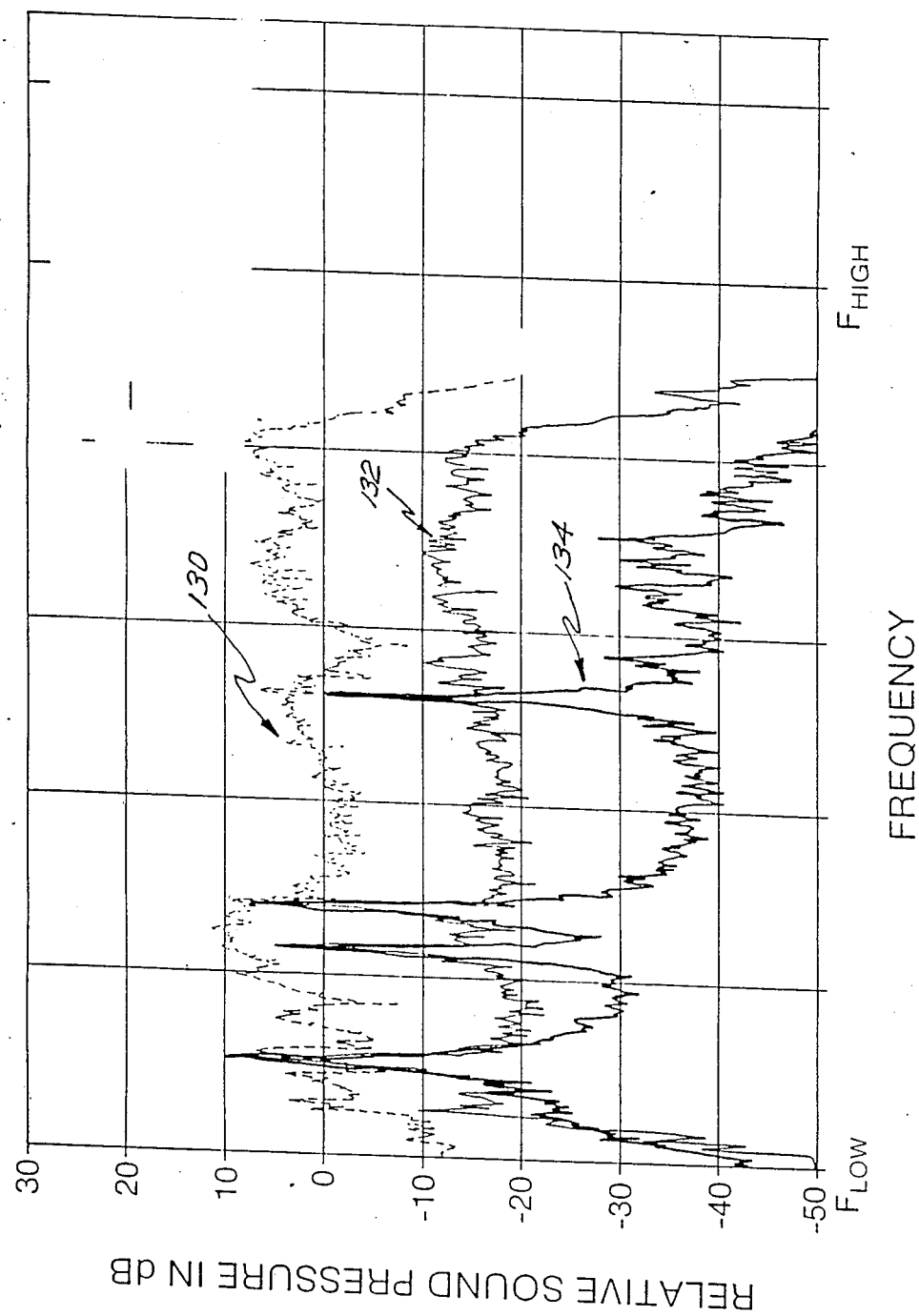
FIG. 7 shows the input (signal-plus-noise) to the first adaptive filter, output of the first adaptive filter to be used as input to the second adaptive filter, and output of the second filter over the given frequency range.

In all these methods, the "clean noise" goes to $R_2$ of adaptive filter 102 ($F_2$), while the Output$_1$ of filter $F_1$ goes to $P_2$ of the second filter, and the resultant second cancellation at Output$_2$ is indicated as curve 114 of FIGS. 4(e) and 6.

In each of the three noise cancellation methods discussed, a third stage of cancellation can be cascaded by adding two additional adaptive filters after adaptive filter $F_2$, giving a total of five adaptive filters. And for N stages of cancellation, the number of adaptive filters required is 2N−1. However, a law of diminishing returns shows up. For, although the noise floor seems to drop an additional 6 or 7 dB with three stages of cancellation, a new digital noise arises from the signal processing itself, making the usefulness of multi-stage cancellation doubtful for three or more stages.

Figure 8:
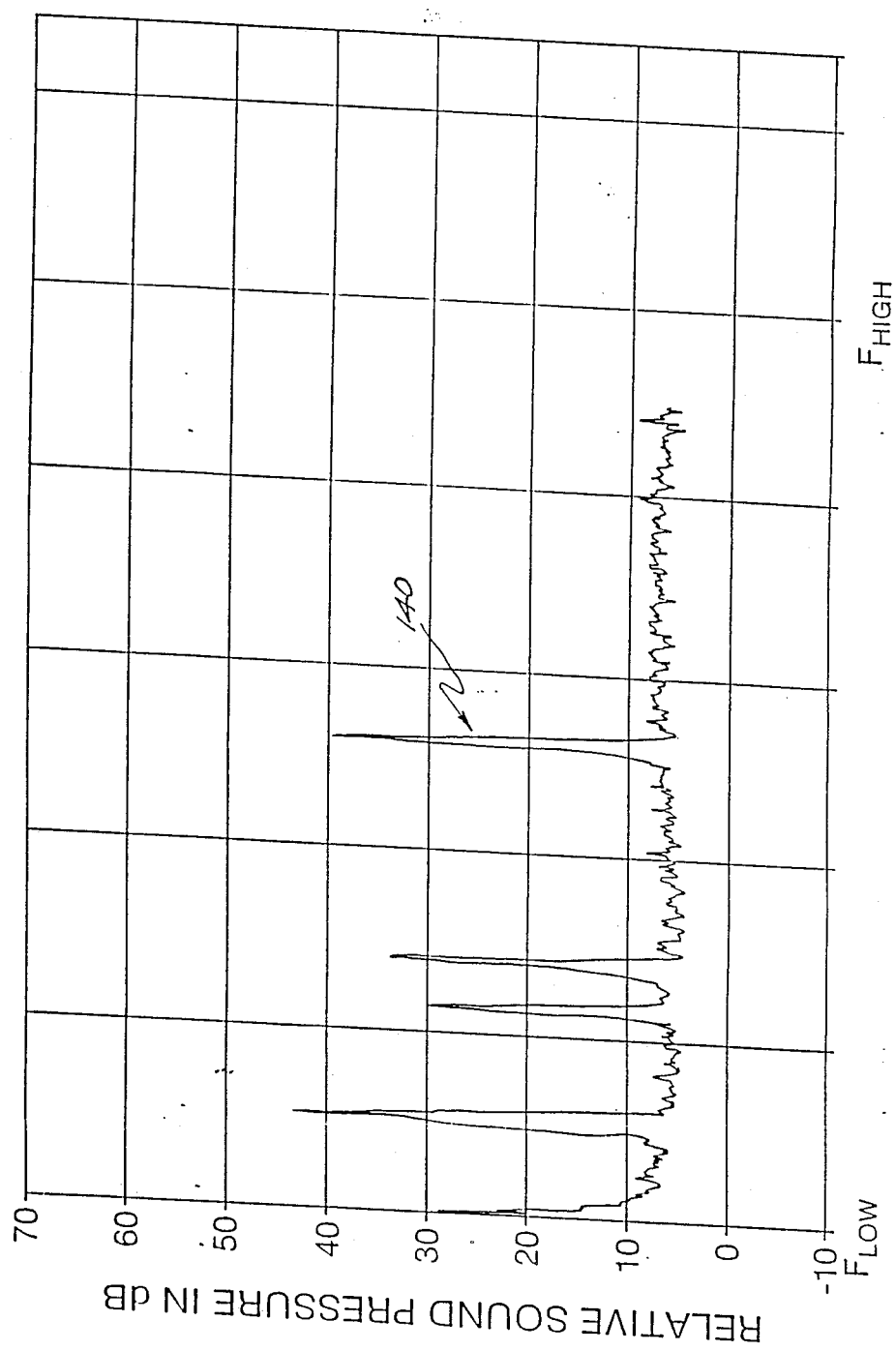
FIG. 8 is the normalized output of the final or second adaptive filter over the given frequency range.

Another advantage of a three-filter method is displayed in FIG. 8 wherein curve 140 shows the relative frequency response of four tones after a single noise-cancellation. Basically the autospectrum at the output of first adaptive filter 100 ($F_1$) is mathematically divided by the "clean noise" autospectrum at the output of adaptive filter ($F_{int}$); but since we are using logarithmic units, namely dB, we subtract (not divide) the two autospectra. Notice the straightened-out baseline. The three-filter method also allows other 2-channel comparisons to be made such as cross-correlation and coherence.

Thus a multiple stage noise-cancelling system according to the teachings of subject invention comprises a first adaptive filter and a plurality of pairs of adaptive filters, each stage requiring one pair of adaptive filters (wherein each adaptive filter includes one primary channel and one reference channel). Thus each stage of noise cancellation is cascaded by using an additional pair of adaptive filters wherein "clean noise" becomes the input to the reference channel of the second filter. The noise cancellation of the two successive stages is logarithmically additive.

Many modifications and variations of the presently disclosed invention are possible in light of the above teachings. As an example, the number of stages in the noise cancellation system can be varied without deviating from the teachings of subject invention. The number of signal tones buried in the noise may vary. Furthermore, the frequency range over which the signal tones are distributed may also vary. It is therefore understood that within the scope of the appended claims, the invention may be practiced otherwise than as specifically described.

What is claimed is:

1. An electronic noise-reducing system, wherein the noise comes from a nearfield noise source, utilizing a plurality of adaptive filters, including a final filter, fed by at least two sensors, namely a reference sensor comprising at least two electroacoustic elements, and an omnidirectional primary sensor, wherein at least one electroacoustic element of the reference sensor is used both in the reference sensor and simultaneously in the primary sensor; and wherein only the output of the final filter is used as the output of the system.

2. The electronic noise-reducing system of claim 1 wherein said plurality of adaptive filters used is equal to $2N-1$ where N is an integer having values of 2, 3, 4, . . . respectively representing second, third, fourth, fifth, . . . stages of noise-reduction and each stage thereof using a primary channel and a reference channel.

3. The electronic noise-reducing system of claim 2 having said plurality of adaptive filters to be three (with $N=2$) and thus including two noise-reduction stages wherein the first adaptive filter delivers a noise-reduced wave at the output thereof, the intermediate adaptive filter delivers "clean noise" as output thereof, and the final adaptive filter delivers an improved noise-reduced output with the tones having an increased signal-to-noise ratio.

4. The electronic noise-reducing system as in claim 2 wherein each of said second, third, fourth, fifth, . . . stages of noise reduction uses "clean noise" as input to the primary and reference channels of the intermediate adaptive filters.

5. The electronic noise-reducing system of claim 4 wherein said plurality of adaptive filters are least mean square (LMS) adaptive filters.

6. The electronic noise-reducing system of claim 4 wherein the electroacoustic element of said reference sensor used simultaneously as the primary sensor is the element closest to the nearfield noise source.

7. The electronic noise-reducing system of claim 6, wherein said reference sensor comprising at least two electroacoustic elements is a line microphone having its axis positioned at an angle to a plane in which said nearfield noise source lies.

8. The electronic noise-reducing system of claim 7 wherein the directional reference sensor comprising at least two electroacoustic elements is a line microphone with axis thereof perpendicular to the plane of said nearfield noise source.

* * * * *